(12) United States Patent
Sasaki et al.

(10) Patent No.: US 12,283,309 B2
(45) Date of Patent: Apr. 22, 2025

(54) PSEUDO-STATIC RANDOM-ACCESS MEMORY AND READING METHOD THEREOF

(71) Applicant: Winbond Electronics Corp., Taichung (TW)

(72) Inventors: Junichi Sasaki, Kanagawa (JP); Kaoru Mori, Kanagawa (JP)

(73) Assignee: Winbond Electronics Corp., Taichung (TW)

( * ) Notice: Subject to any disclaimer, the term of this patent is extended or adjusted under 35 U.S.C. 154(b) by 220 days.

(21) Appl. No.: 18/306,249

(22) Filed: Apr. 25, 2023

(65) Prior Publication Data

US 2023/0352083 A1 Nov. 2, 2023

(30) Foreign Application Priority Data

Apr. 28, 2022 (JP) ................. 2022-073917

(51) Int. Cl.
*G11C 11/406* (2006.01)
*G11C 11/4076* (2006.01)
*G11C 11/408* (2006.01)
*G11C 11/4096* (2006.01)

(52) U.S. Cl.
CPC .... *G11C 11/4096* (2013.01); *G11C 11/40615* (2013.01); *G11C 11/4076* (2013.01); *G11C 11/4087* (2013.01)

(58) Field of Classification Search
CPC .......... G11C 11/4096; G11C 11/40615; G11C 11/4076; G11C 11/4087

USPC ..................................................... 365/189.15
See application file for complete search history.

(56) References Cited

U.S. PATENT DOCUMENTS

| 7,983,103 | B2 | 7/2011 | Tsukude |
| 10,395,720 | B2* | 8/2019 | Nakaoka ............. G11C 11/4085 |
| 2024/0265955 | A1* | 8/2024 | Wu ....................... G11C 7/1093 |

FOREIGN PATENT DOCUMENTS

| CN | 104331145 | 2/2015 |
| JP | H06195963 | 7/1994 |
| JP | 1097366 | 1/1997 |
| TW | I517151 | 1/2016 |
| WO | 2007116827 | 10/2007 |

* cited by examiner

*Primary Examiner* — Ly D Pham
(74) *Attorney, Agent, or Firm* — JCIPRNET (57) ABSTRACT

A pseudo-static random-access memory is provided. A count-and-command decoder starts counting a clock signal when an internal enable signal changes from a disable state to an enable state, and outputs a column address strobe signal at a first level when the count reaches a first clock amount. During a period starting from when the column address strobe signal changes from a second level to the first level to when the internal enable signal changes from the enable state to the disable state, a burst-length counter counts the clock signal to provide a burst length accordingly. A delay control circuit outputs a first confirmation signal at the first level to a row-and-column control circuit, such that a length of a column select signal is equal to the burst length.

20 Claims, 5 Drawing Sheets

PSEUDO-STATIC RANDOM-ACCESS MEMORY AND READING METHOD THEREOF

CROSS-REFERENCE TO RELATED APPLICATION

This application claims the priority benefit of Japan application serial no. 2022-073917, filed on Apr. 28, 2022. The entirety of the above-mentioned patent application is hereby incorporated by reference herein and made a part of this specification.

BACKGROUND

Technical Field

The present disclosure relates to a method for accessing a memory, particular to a reading method of a pseudo-static random-access memory.

Description of Related Art

In the development of semiconductor memory in recent years, in response to the needs of high-speed access and miniaturization, the pseudo-static random-access memory (pSRAM) has gained its popularity especially on mobile devices, as it has the advantages of both static random-access memory (SRAM) and dynamic random-access memory (DRAM).

In a conventional pSRAM, in order to reduce the number of external pins, the readout of data is controlled by a chip enable signal (CE #) pin, a chip clock signal (CLK) pin, and a data input/output pin ADQ. The chip enable pin is configured to provide a chip enable signal CE #to enable or disable the pSRAM. When the pSRAM is enabled, commands and addresses can be received through the data input/output pin ADQ, and an input receiver in the pSRAM is enabled to start accessing the memory cell according to the commands and addresses received, and output the data through the data input/output pin ADQ after the read delay. In addition, the read operation is terminated in response to the rising edge of the chip enable signal CE #, meaning that the pSRAM stops outputting data and stops generating the column-select pulse of the column select signal CSL, and a word line signal WL is turned off (and has a low potential, for example) after the last pulse of the column select signal CSL falls. When the pSRAM is disabled (i.e., in the standby state), the input receiver is also disabled to save power. However, based on the control method above, a column select signal CSL of a fixed length (i.e., N column-select pulses) is to be generated, and the fixed length is greater than the time length required for the data input/output pin ADQ to output data, such that the column-select pulses are kept being output during the period when the data input/output pin ADQ outputs data. In other words, the column select signal CSL has redundant pulses, thereby causing unnecessary power consumption. Moreover, as the next operation (e.g., refresh operation or access operation) can only be performed after the word line signal WL is turned off, the control method above also has the problem of long operation time.

In the case of pSRAM using the cell structure of double data rate synchronous dynamic random-access memory (DDR SDRAM), when a read operation is performed, two data can be read in a cycle of a column select signal CSL. However, the problem mentioned above is even more serious in this case.

SUMMARY

The disclosure provides a pseudo-static random-access memory and a reading method thereof capable of adjusting the length of a column select signal CSL dynamically according to the number of read data.

The pseudo-static random-access memory of the disclosure includes a memory array, an input/output circuit, a count-and-command decoder, a burst-length counter, a row-and-column control circuit, a delay control circuit, and an input/output control circuit. The input/output circuit receives a read command sequence from the data input/output pins, and generates a read command, a read row address, and a read column address according to the read command sequence. The count-and-command decoder receives an internal enable signal, a clock signal, and the read command, decodes the read command, and starts counting the clock signal when the internal enable signal changes from the disable state to the enable state and output a column address strobe signal at a first level when the count reaches a first clock amount. The burst-length counter receives the clock signal, the internal enable signal, and the column address strobe signal, and counts the clock signal during a period starting from when the column address strobe signal changes from a second level to the first level to when the internal enable signal changes from an enable state to a disable state, so as to provide a burst length accordingly. The row-and-column control circuit receives the clock signal, a column select enable signal, and the read column address. When the column select enable signal changes from the second level to the first level, the row-and-column control circuit outputs a column select signal to the memory array according to the read column address in response to the clock signal. The delay control circuit receives the column select enable signal and the burst length. After the column select enable signal changes from the second level to the first level and is delayed by the burst length, the delay control circuit outputs a first confirmation signal at the first level to the row-and-column control circuit, such that the length of the column select signal is equal to the burst length.

The reading method of the pseudo-static random-access memory of the disclosure includes the following steps: receiving a read command sequence from a data input/output pin, and generating a reading command, a read row address, and a read column address according to the read command sequence; decoding the read command, and starting to count a clock signal when an internal enable signal changes from the disable state to the enable state, and outputting a column address strobe signal a first level when the count reaches a first clock amount; counting the clock signal during a period starting from when the column address strobe signal changes from a second level to the first level to when the internal enable signal changes from the enable state to the disable state, so as to provide a burst length accordingly; and outputting a first confirmation signal at the first level after a column select enable signal changes from the second level to the first level and is then delayed by the burst length, such that a length of a column select signal is equal to the burst length.

Based on the above, whenever a read operation is performed, the pseudo-static random-access memory of the disclosure calculates a burst length suitable for the amount of read data, and makes the length of the column select signal equal to the burst length, to thereby prevent generating unnecessary column select signals, reduce the current consumption, and/or accelerate the processing speed of the read operation.

DESCRIPTION OF THE EMBODIMENTS

Figure 1:
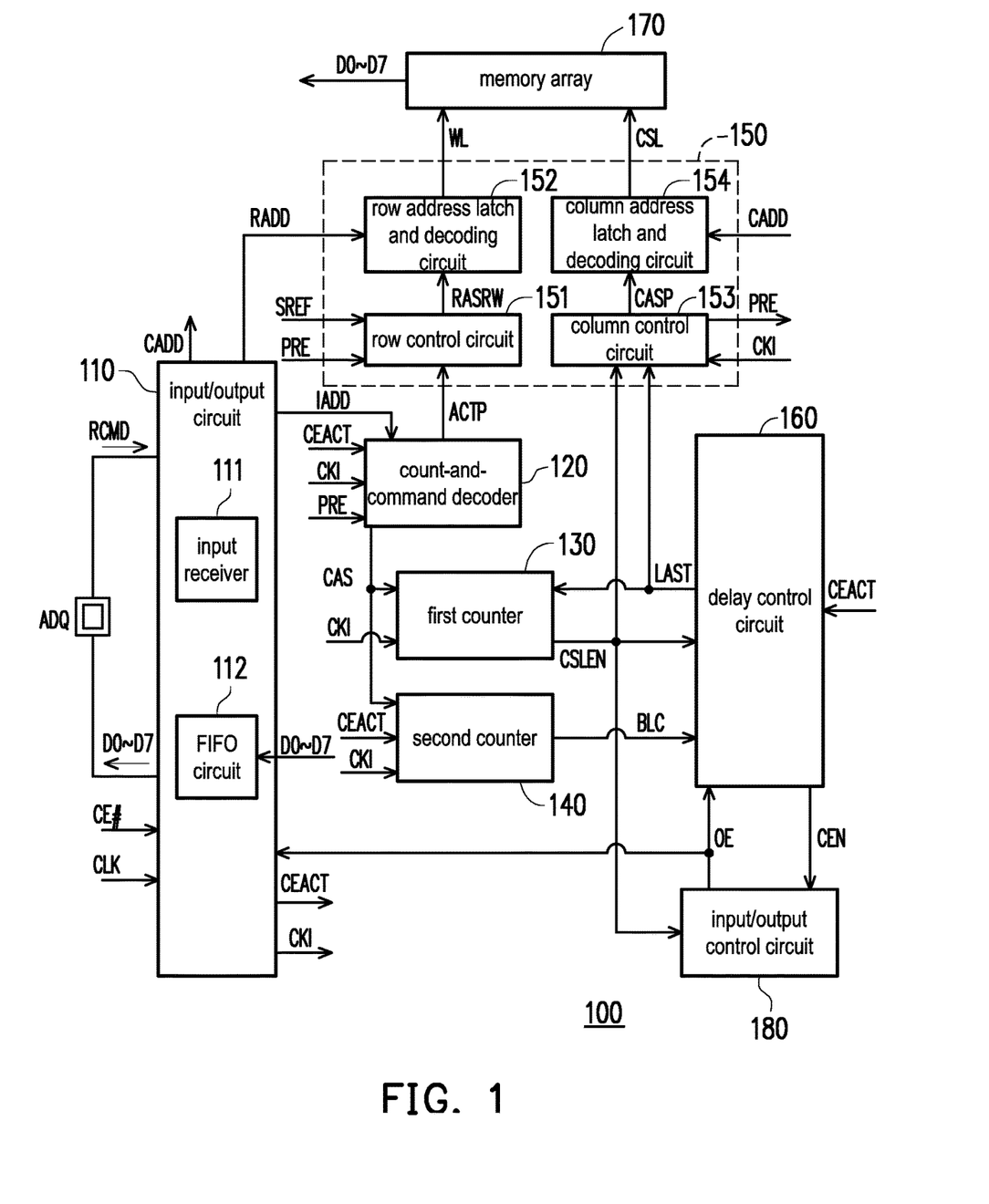
FIG. 1 is a schematic circuit diagram of a pseudo-static random-access memory according to an embodiment of the disclosure.

In FIG. 1, the pseudo-static random-access memory (pSRAM) 100 of an embodiment of the disclosure includes an input/output circuit 110, a count-and-command decoder 120, a first counter 130, a second counter (or called a burst-length counter) 140, a row-and-column control circuit 150, a delay control circuit 160, a memory array 170 and an input/output control circuit 180. In this embodiment, the input-output circuit 110 includes an input receiver 111, and a first-in-first-out (FIFO) circuit 112. When the read operation is performed, the input receiver 111 receives a read command sequence RCMD from a data input/output pin ADQ. The input/output circuit 110 generates a read command IADD, a read row address RADD, and a read column address CADD according to the read command sequence RCMD, provides the read command IADD to the count-and-command decoder 120, and provides the read row address RADD and the read column address CADD to the row-and-column control circuit 150. The FIFO circuit 112 is controlled by an output enable signal OE from the input/output control circuit 180 to output data.

Figure 3:
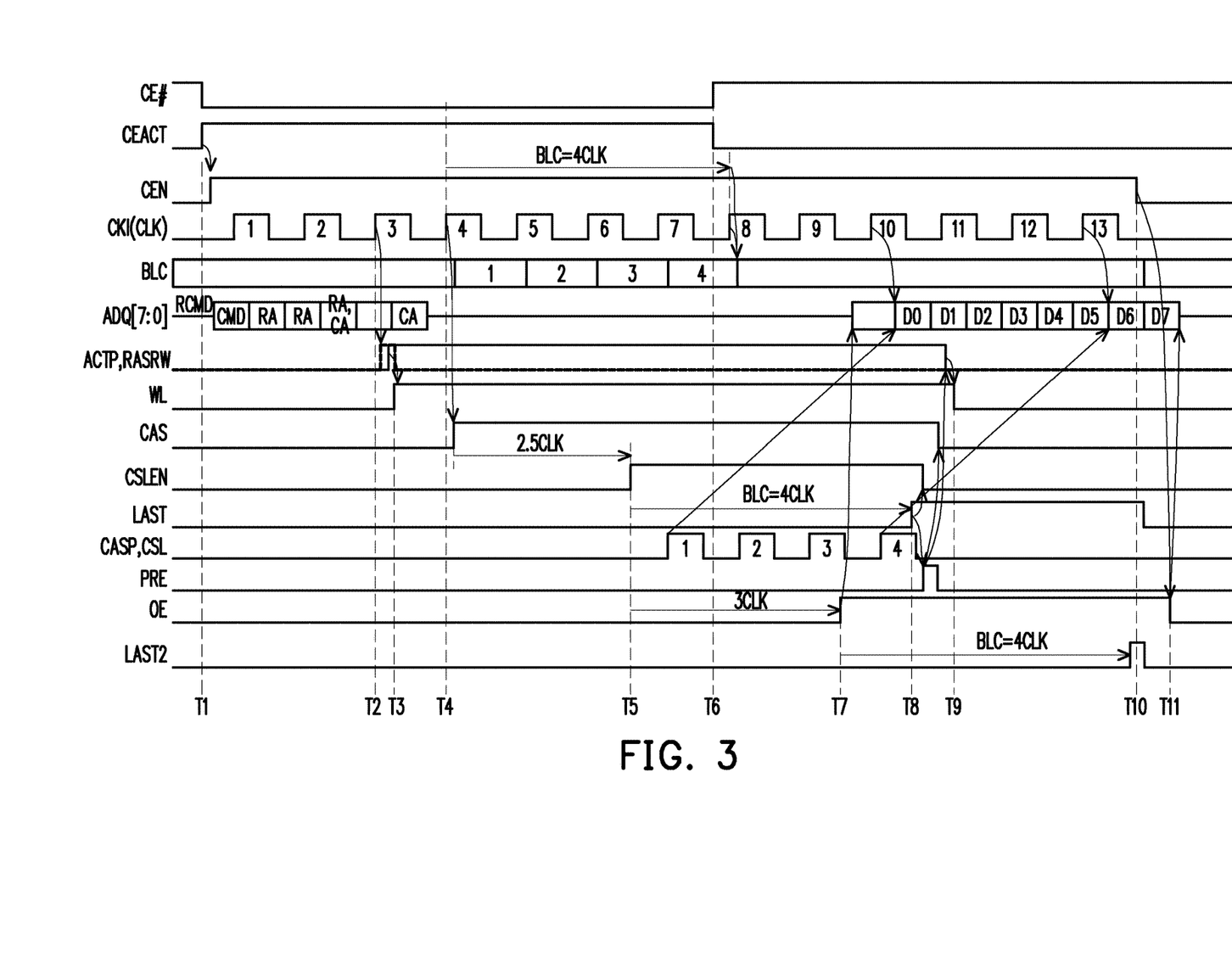
FIG. 3 is a schematic waveform diagram of a read operation of a pseudo-static random-access memory according to an embodiment of the disclosure.

The count-and-command decoder 120 is coupled to the input/output circuit 110 and receives the internal enable signal CEACT and the clock signal CKI. In this example, the chip enable signal CE #and the chip clock signal CLK received externally may be respectively used as the internal enable signal CEACT and the clock signal CKI for the internal elements of the pSRAM 100 through the input/output circuit 110. As shown in FIG. 3, the internal enable signal CEACT has a polarity inversion waveform with respect to the chip enable signal CE #, and the chip clock signal CLK and the clock signal CKI share the same waveform.

The count-and-command decoder 120 decodes the read command IADD to see whether a read operation is to be performed. When a read operation is to be performed, the chip enable signal CE #is to be enabled (at a low logic level, for example), and the internal enable signal CEACT is also enabled (at a high logic level, for example). The count-and-command decoder 120 starts counting the clock signal CKI when the internal enable signal CEACT changes from the disable state to the enable state.

When the count reaches a first clock amount, the count-and-command decoder 120 outputs the column address strobe signal CAS at the first level to the first counter 130 and the second counter 140. In this embodiment, the first clock amount is, for example, the rising edge of the fourth clock pulse of the clock signal CKI after the count starts.

The first counter 130 is coupled to the count-and-command decoder 120 and receives the clock signal CKI and the column address strobe signal CAS. When the column address strobe signal CAS from the count-and-command decoder 120 changes from the second level to the first level, the first counter 130 starts counting the clock signal CKI. In this embodiment, the first level is a high logic level, and the second level is a low logic level, but the disclosure is not limited thereto.

When the count reaches the first delay time, the first counter 130 outputs the column select enable signal CSLEN at the first level to the row-and-column control circuit 150, the delay control circuit 160, and the input/output control circuit 180. In this embodiment, the first delay time is, for example, 2.5 cycles of the clock signal CKI, but the disclosure is not limited thereto, and those skilled in the art can resort to the teaching of the disclosure and come up with modifications based on the teaching as needed.

The second counter 140 is coupled to the count-and-command decoder 120 and receives the clock signal CKI, the internal enable signal CEACT, and the column address strobe signal CAS. When the column address strobe signal CAS changes from the second level to the first level, the second counter 140 also starts counting the clock signal CKI until the internal enable signal CEACT changes from the enable state to the disable state. In other words, the second counter 140 counts the clock signal CKI during the period starting from the column address strobe signal CAS from the count-and-command decoder 120 changes from the second level to the first level to when the internal enable signal CEACT changes from the enable state to the disable state, so as to provide a burst length BLC. In this embodiment, the internal enable signal CEACT can be adapted to determine the burst length BLC. For example, whenever a read operation occurs, the chip enable signal CE #from the outside of the memory dynamically changes the time point of changing into a disable state (at a high logic level, for example) according to the number of read data, and the internal enable signal CEACT also changes accordingly. In this way, the second counter 140 is able to count the clock signal CKI during the period starting from when the column address strobe signal CAS changes from the second level to the first level to when the internal enable signal CEACT changes from the enable state to the disable state. And the count is to be stopped at the rising edge of the next clock signal CKI after the internal enable signal CEACT is disabled, and the counting result is provided to the delay control circuit 160 as the burst length BLC.

The row-and-column control circuit 150 is coupled to the input/output circuit 110, the count-and-command decoder 120, and the first counter 130, and receives the clock signal CKI, the column select enable signal CSLEN, and the read column address CADD. After the column select enable signal CSLEN changes from the second level to the first level, the row-and-column control circuit 150 responds to the clock signal CKI and outputs the column select signal CSL to the memory array 170 according to the read column address CADD.

The delay control circuit 160 is coupled to the row-and-column control circuit 150, the first counter 130, and the second counter 140, and receives the column select enable signal CSLEN, the burst length BLC, and the internal enable signal CEACT. After the column select enable signal CSLEN changes from the second level to the first level and is then delayed by the burst length BLC, the delay control circuit 160 outputs a first confirmation signal LAST at the first level to the row-and-column control circuit 150, such that the length (i.e., the number of cycles) of the column select signal CSL is equal to the burst length BLC.

Figure 2A:
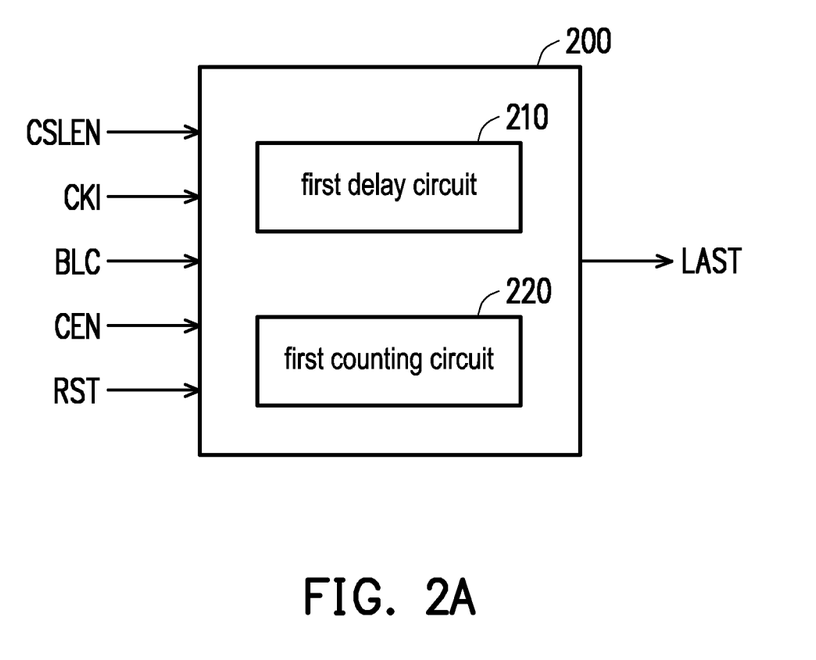
FIG. 2A is a schematic circuit diagram of a confirmation signal control circuit according to an embodiment of the disclosure.

Specifically, in an embodiment of the disclosure, the delay control circuit 160 includes a confirmation signal control circuit 200 and a chip disable signal control circuit 300. As shown in FIG. 2A, the confirmation signal control circuit 200 is configured to receive the column select enable signal CSLEN, the clock signal CKI, the burst length BLC, the chip disable signal CEN, and the reset signal RST to generate the first confirmation signal LAST. The confirmation signal control circuit 200 includes a first delay circuit 210 and a first counting circuit 220. The first delay circuit 210 is configured to delay the column select enable signal CSLEN by a time equal to the burst length BLC to generate the first confirmation signal LAST. The first counting circuit 220 is configured to count the clock signal CKI to set the delay time of the column select enable signal CSLEN equal to the burst length BLC. For example, when the burst length BLC is equal to the clock signal CKI of 4 clock cycles, after the column select enable signal CSLEN is changed to the first level, the first delay circuit 210 changes the first confirmation signal LAST in the fourth clock cycle of the clock signal CKI to the first level. In addition, when the chip disable signal CEN or the reset signal RST are changed to the second level, the first confirmation signal LAST is to be reset to the second level.

Figure 2B:
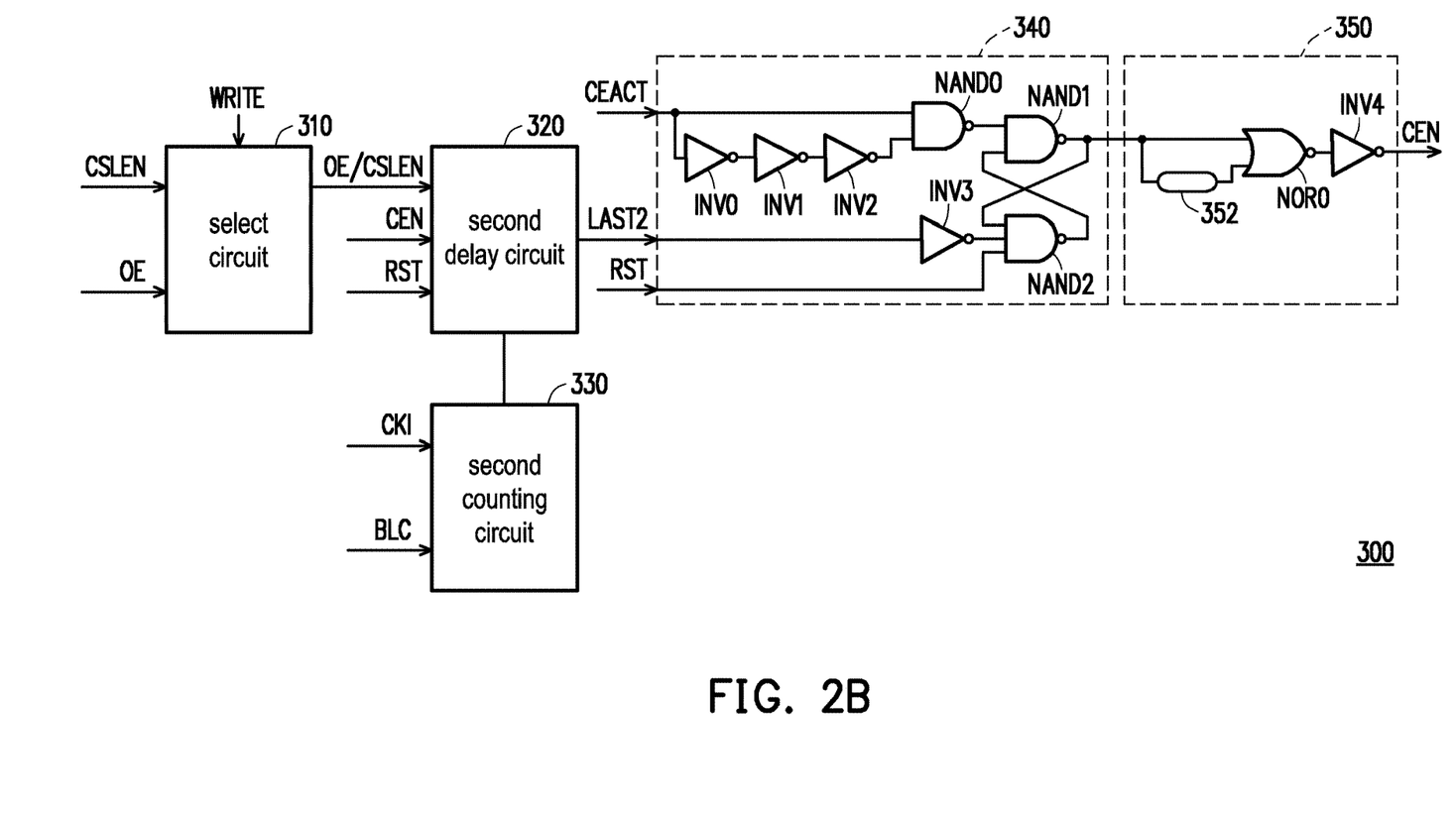
FIG. 2B is a schematic circuit diagram of a chip disable signal control circuit according to an embodiment of the disclosure.

In addition, as shown in FIG. 2B, the chip disable signal control circuit 300 includes a select circuit 310, a second delay circuit 320, a second counting circuit 330, a flip-flop 340 and a logic circuit 350. The select circuit 310 is configured to select the output enable signal OE or the column select enable signal CSLEN as an output according to a write signal WRITE, and provide the selected result to the second delay circuit 320. In the read operation, the select circuit selects the output enable signal OE as an output, and provides the output enable signal OE to the second delay circuit 320. The second delay circuit 320 is configured to delay the output enable signal OE by a time equal to the burst length BLC to generate the second confirmation signal LAST2. The second counting circuit 330 is configured to count the clock signal CKI to set the delay time of the output enable signal OE equal to the burst length BLC. For example, when the burst length BLC is equal to the clock signal CKI of 4 clock cycles, after the output enable signal OE is changed into the first level, the second confirmation signal LAST2 is changed into the first level in the fourth clock cycle of the clock signal CKI. The flip-flop 340 is configured to receive the second confirmation signal LAST2, the internal enable signal CEACT, and the reset signal RST to generate the chip disable signal CEN. As shown in FIG. 2B, the flip-flop 340 includes inverters INV0 to INV3 and NAND gates NAND0 to NAND2. The flip-flop 340 is specifically set according to the rising edge of the internal enable signal CEACT, and reset according to the rising edge of the second confirmation signal LAST2 or the reset signal RST changing to the second level. In addition, the output end of the flip-flop 340 may be coupled to the logic circuit 350 and generate the chip disable signal CEN through the logic circuit 350. As shown in FIG. 2B, the logic circuit 350 includes a delay unit 352, an NOR gate NOR0, and an inverter INV4.

In this embodiment, the row-and-column control circuit includes a row control circuit 151, a row address latch and decoding circuit 152, a column control circuit 153, and a column address latch and decoding circuit 154. The row control circuit 151 is configured to receive a self-refresh signal SREF that indicates whether a self-refresh operation is performed. In this embodiment, the self-refresh signal SREF at the first level indicates that the pSRAM 100 is performing a self-refresh operation.

And when the count of the clock signal CKI conducted by the count-and-command decoder 120 reaches a second clock amount, the count-and-command decoder 120 may output a ready pulse ACTP to the row control circuit 151. In this embodiment, the second clock amount is, for example, the rising edge of the third clock pulse of the clock signal CKI after the count starts. When the row control circuit 151 receives the ready pulse ACTP as the self-refresh signal SREF is at the second level (which indicates that the self-refresh operation is yet to be performed), the row control circuit 151 outputs the row address strobe signal RASRW at the first level to the row address latch and decoding circuit 152.

The row address latch and decoding circuit 152 is coupled to the row control circuit 151 and receives the read row address RADD and the row address strobe signal RASRW. When the row address strobe signal RASRW changes from the second level to the first level, the row address latch and decoding circuit 152 may select the memory cell row address to be read according to the read row address RADD, and output to the memory array 170 the corresponding word line signal WL.

The column control circuit 153 receives the clock signal CKI, the column select enable signal CSLEN and the first confirmation signal LAST. When the column select enable signal CSLEN changes from the second level to the first level, the column control circuit 153 outputs a column-select pulse sequence CASP to the column address latch and decoding circuit 154 in response to the clock signal CKI.

The column address latch and decoding circuit 154 receives the read column address CADD and is coupled to the column control circuit 153, and is configured to select the memory cell column address to be read according to the read column address CADD, and output the corresponding column select signal CSL to the memory array 170 in response to the column-select pulse sequence CASP. In this way, the pSRAM 100 can read the data stored in the memory array 170 via the word line signal WL and the column select signal CSL, and transmit the read output data D0 to D7 in sequence to the FIFO circuit 112 of the input/output circuit 110.

Then, after the column select enable signal CSLEN changes from the second level to the first level and is then delayed by the burst length BLC (that is, when the length of the column select signal CSL reaches the burst length BLC), the delay control circuit 160 changes the first confirmation signal LAST from the second level to the first level. Accordingly, the column control circuit 153 stops outputting the column-select pulse sequence CASP, such that the column address latch and decoding circuit 154 stops outputting the column select signal CSL.

And when the first confirmation signal LAST changes from the second level to the first level, the column control circuit 153 outputs the control pulse PRE to the count-and-command decoder 120 and the row control circuit 151, such that the count-and-command decoder 120 and the row control circuit 151 respectively output the column address strobe signal CAS at the second level and the row address strobe signal RASRW at the second level.

Similarly, when the first confirmation signal LAST changes from the second level to the first level, the first counter 130 also outputs the column select enable signal CSLEN at the second level.

In this embodiment, the input/output control circuit 180 is coupled to the first counter 130, the input/output circuit 110, and the delay control circuit 160, and receives the column select enable signal CSLEN. After the column select enable signal CSLEN changes from the second level to the first level and is then delayed by a second delay time, the input/output control circuit 180 outputs the output enable signal OE at the first level to the input/output circuit 110 and the delay control circuit 160. In this way, when the output enable signal OE changes from the second level to the first level, the FIFO circuit 112 is able to start transmitting the output data D0 to D7 read from the memory array 170 to the data input/output pin ADQ for further output. The second delay time is, for example, 3 cycles of the clock signal CKI, but the disclosure is not limited thereto, and those skilled in the art can resort to the teaching of the disclosure and come up with modifications based on the teaching as needed.

Also, after the output enable signal OE changes from the second level to the first level and is delayed by the burst length BLC, the delay control circuit 160 outputs the chip disable signal CEN at the second level to the input/output control circuit 180.

When the chip disable signal CEN changes from the first level to the second level, the input/output control circuit 180 outputs the output enable signal OE at the second level to the input/output circuit 110 to end the data output, and stands by for the next action.

In this embodiment, the first counter 130 and the second counter 140 may be conventional counting circuits with counting functions (but not limited thereto); the memory array 170 is, for example, a DRAM array suitable for pSRAM; the input/output circuit 110, the count-and-command decoder 120, the row-and-column control circuit 150, the delay control circuit 160, and the input/output control circuit 180 may also be implemented in a memory circuit architecture known to those skilled in the field of integrated circuits.

To elucidate the technology of the disclosure, the following examples are provided to describe the signal timing of the disclosure in detail. FIG. 3 is a schematic waveform diagram of a read operation of a pSRAM according to an embodiment of the disclosure. The read operation of the pSRAM 100 is described with reference to FIG. 1 and FIG. 3 simultaneously. In the following description, the first level is, for example, a high logic level, and the second level is, for example, a low logic level, but the disclosure is not limited thereto.

As shown in FIG. 3, when a read operation is to be performed, the internal enable signal CEACT (inversion of the chip enable signal CE #) first changes from a disable state to an enable state (e.g., from a low logic level to high logic level) at a time point T1. Accordingly, the delay control circuit 160 outputs the chip disable signal CEN at the first level to the input/output control circuit 110 to receive the read command sequence RCMD from the data input/output pin ADQ. As shown in FIG. 3, the read command sequence RCMD includes a command CMD, a row address RA, and a column address CA. The input/output circuit 110 generates a read command IADD, a read row address RADD, and a read column address CADD according to the read command sequence RCMD.

In this embodiment, for example, the command CMD is input at the rising edge of the first clock cycle of the clock signal CKI after the internal enable signal CEACT (the chip enable signal CE #) becomes enabled; then, the row address RA is sequentially input at the falling edge of the first clock cycle, the rising edge of the second clock cycle, and the falling edge of the second clock cycle of the clock signal CKI; and all input row addresses RA are latched as the read row address RADD.

The count-and-command decoder 120 may start counting the clock signal CKI when the internal enable signal CEACT changes from the disable state to the enable state. As shown in FIG. 3, when the count reaches the rising edge of the third clock cycle (i.e., time point T2), the count-and-command decoder 120 outputs the ready pulse ACTP to the row control circuit 151. When the ready pulse ACTP is received when the self-refresh signal SREF is at the second level, the row control circuit 151 outputs the row address strobe signal RASRW at the first level.

As shown in FIG. 3, when the row address strobe signal RASRW changes from the second level to the first level, the row address latch and decoding circuit 152 outputs the corresponding word line signal WL at the time point T3.

As shown in FIG. 3, when the count of the clock signal CKI conducted by the count-and-command decoder 120 reaches the rising edge of the fourth clock cycle (i.e., the time point T4), the count-and-command decoder 120 outputs the column address strobe signal CAS at the first level. For example, in this embodiment, after all input of the column addresses are completed at the falling edge of the third clock cycle, the column address strobe signal CAS at the first level is output.

When the column address strobe signal CAS changes from the second level to the first level, the second counter 140 starts counting the clock signal CKI.

And when the column address strobe signal CAS changes from the second level to the first level, the first counter 130 also starts counting the clock signal CKI. As shown in FIG. 3, when the count reaches 2.5 cycles (2.5CLK) of the clock signal CKI (i.e., at the time point T5), the first counter 130 outputs the column select enable signal CSLEN at the first level.

As shown in FIG. 3, when the column select enable signal CSLEN changes from the second level to the first level, the column control circuit 153 outputs the column-select pulse sequence CASP in response to the clock signal CKI, the column address latch and decoding circuit 154 selects the memory cell column address to be read according to the read column address CADD, and the corresponding column select signal CSL is outputted in response to the column-select pulse sequence CASP to start reading the memory array 170 with the word line signal WL.

As shown in FIG. 3, the internal enable signal CEACT (the inversion of the chip enable signal CE #) changes from the enable state to the disable state (e.g., from a high logic level to a low logic level) at the time point T6. Accordingly, the second counter 140 stops counting at the next rising edge of the clock signal CKI, and provides the counting result as the burst length BLC to the delay control circuit 160.

Next, as shown in FIG. 3, after the column select enable signal CSLEN changes from the second level to the first level at the time point T5 and is then delayed for 3 cycles (3CLK) of the clock signal CKI (i.e., the time point T7), the input/output control circuit 180 outputs the output enable signal OE at the first level, such that the FIFO circuit 112 may start transmitting the output data D0 to D7 read from the memory array 170 to the data input/output pin ADQ for further output.

After the column select enable signal CSLEN changes from the second level to the first level at the time point T5 and is then delayed by the burst length BLC which is equivalent to 4CLK (i.e., the time point T8), the delay control circuit 160 outputs the first confirmation signal LAST at the first level.

As shown in FIG. 3, when the first confirmation signal LAST changes from the second level to the first level, the column control circuit 153 stops outputting the column-select pulse sequence CASP, and the column address latch and decoding circuit 154 stops outputting the column select signal CSL. At the same time, the column control circuit 153 outputs the control pulse PRE to the count-and-command decoder 120 and the row control circuit 151, such that the count-and-command decoder 120 and the row control circuit 151 respectively output the column address strobe signal CAS at the second level and the row address strobe signal RASRW at the second level. Similarly, as shown in FIG. 3, when the first confirmation signal LAST changes from the second level to the first level, the first counter 130 also outputs the column select enable signal CSLEN at the second level.

As shown in FIG. 3, because the row address strobe signal RASRW changes from the first level to the second level, the row address latch and decoding circuit 152 also stops outputting the word line signal WL at the time point T9.

The delay control circuit 160 receives the output enable signal OE from the input/output circuit 180. After the output enable signal OE changes from the second level to the first level at the time point T7, the delay control circuit 160 generates the second confirmation signal LAST2 at the first level after the burst length BLC (i.e., 4CLK), such that the chip disable signal CEN at the second level is output at the time point T10.

Because the chip disable signal CEN changes from the first level to the second level, the input/output control circuit 180 outputs the output enable signal OE at the second level to the input/output circuit 110 at the time point T11 to end the output operation of the output data D0 to D7.

Based on the above operation, the pSRAM of the disclosure is capable of calculating the burst length suitable for the amount of read data, providing a length of the column select signal sequence equal to the burst length. As the length of the column select signal CSL is shortened, the time period of the read operation may be advanced, having less current consumption and faster operation speed than those in the conventional technology. Furthermore, in the conventional read operation of pSRAM, the chip enable signal CE #must be disabled to stop the pulse of the column select signal CSL from being generated, meaning that the rising edge of the chip enable signal CE #indicates the end of the read operation. In contrast, in this embodiment, the rising edge of the chip enable signal CE #is adapted to indicate the end time point of counting the burst length, which is not directly related to the end of the read operation.

Figure 4:
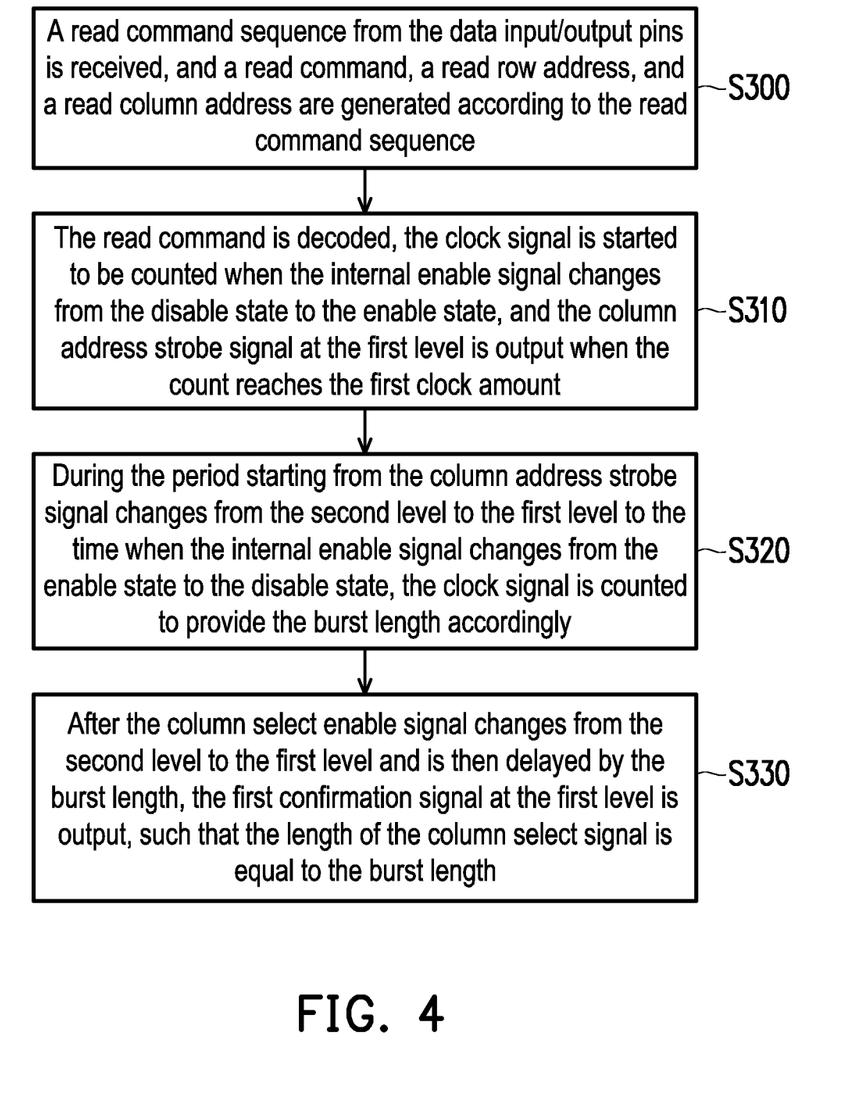
FIG. 4 is a flowchart of a method for reading a pseudo-static random-access memory according to an embodiment of the disclosure.

As shown in FIG. 4, a method for reading a pSRAM according to an embodiment of the disclosure includes the following steps. A read command sequence from the data input/output pins is received, and a read command, a read row address, and a read column address are generated according to the read command sequence (step S300). Next, the read command is decoded, the clock signal is started to be counted when the internal enable signal changes from the disable state to the enable state, and the column address strobe signal at the first level is output when the count reaches the first clock amount (step S310). During the period starting from the column address strobe signal changes from the second level to the first level to the time when the internal enable signal changes from the enable state to the disable state, the clock signal is counted to provide the burst length accordingly (step S320). Lastly, after the column select enable signal changes from the second level to the first level and is then delayed by the burst length, the first confirmation signal at the first level is output, such that the length of the column select signal is equal to the burst length (step S330). Please refer to the embodiments of FIG. 1 to FIG. 3 for details of steps S300, S310, S320, and S330, which are not repeated herein.

To sum up, whenever a read operation is performed, the pSRAM of the disclosure calculates a burst length suitable for the amount of data to be read, and provide a length of the column select signal sequence equal to the burst length. In this way, it takes less time to complete the read operation, thereby reducing unnecessary current consumption and allowing the next operation (such as a refresh operation or an access operation) to be processed earlier.

What is claimed is:

1. A pseudo-static random-access memory, comprising:
 a memory array;
 an input/output circuit configured to receive a read command sequence from a data input/output pin, and generate a read command, a read row address, and a read column address according to the read command sequence;
 a count-and-command decoder coupled to the input/output circuit and configured to:
  receive an internal enable signal, a clock signal, and the read command,
  decode the read command,
  start counting the clock signal when the internal enable signal changes from a disable state to an enable state, and
  output a column address strobe signal at a first level when a count of the clock signal reaches a first clock amount;
 a burst-length counter coupled to the count-and-command decoder and configured to:
  receive the clock signal, the internal enable signal, and the column address strobe signal, and
  count the clock signal during a period starting from when the column address strobe signal changes from a second level to the first level to when the internal enable signal changes from an enable state to a disable state, so as to provide a burst length accordingly;
 a row-and-column control circuit coupled to the input-output circuit and the count-and-command decoder and configured to:
  receive the clock signal, a column select enable signal, and the read column address, and
  in response to the clock signal, output a column select signal to the memory array according to the read column address when the column select enable signal changes from the second level to the first level; and
 a delay control circuit coupled to the row-and-column control circuit and the burst-length counter and configured to:
  receive the column select enable signal and the burst length, and output a first confirmation signal at the first level to the row-and-column control circuit after the column select enable signal changes from the second level to the first level and is then delayed by the burst length, such that a length of the column select signal is equal to the burst length.

2. The pseudo-static random-access memory as claimed in claim 1, further comprising:
a first counter coupled to the count-and-command decoder and the row-and-column control circuit and configured to:
receive the clock signal and the column address strobe signal,
start to count the clock signal when the column address strobe signal changes from the second level to the first level, and
output the column select enable signal at the first level when the count reaches a first delay time.

3. The pseudo-static random-access memory as claimed in claim 2, wherein the row-and-column control circuit comprises:
a row control circuit configured to:
receive a self-refresh signal, and
output a row address strobe signal at the first level upon receiving a ready pulse when the self-refresh signal is at the second level; and
a row address latch and decoding circuit coupled to the row control circuit and configured to:
receive the read row address and the row address strobe signal, and
output a word line signal to the memory array according to the read row address when the row address strobe signal changes from the second level to the first level.

4. The pseudo-static random-access memory as claimed in claim 3, wherein the count-and-command decoder outputs the ready pulse to the row control circuit when the count conducted by the count-and-command decoder reaches a second clock amount.

5. The pseudo-static random-access memory as claimed in claim 3, wherein the row-and-column control circuit further comprises:
a column control circuit configured to:
receive the clock signal, the column select enable signal, and the first confirmation signal, and
output a column-select pulse sequence in response to the clock signal when the column select enable signal changes from the second level to the first level; and
a column address latch and decoding circuit coupled to the column control circuit and configured to output the column select signal to the memory array in response to the column-select pulse sequence according to the read column address.

6. The pseudo-static random-access memory as claimed in claim 5, wherein the first counter outputs the column select enable signal at the second level when the first confirmation signal changes from the second level to the first level.

7. The pseudo-static random-access memory as claimed in claim 5, wherein
the column control circuit stops outputting the column-select pulse sequence when the first confirmation signal changes from the second level to the first level, such that the column address latch and decoding circuit stops outputting the column select signal, and the column control circuit outputs a control pulse to the count-and-command decoder and the row control circuit, such that the count-and-command decoder and the row control circuit respectively output the column address strobe signal at the second level and the row address strobe signal at the second level.

8. The pseudo-static random-access memory as claimed in claim 1, further comprising:
an input/output control circuit coupled to the input-output circuit and the delay control circuit and configured to:
receive the column select enable signal,
output an output enable signal at the first level to the input-output circuit and the delay control circuit after the column select enable signal changes from the second level to the first level and is then delayed by a second delay time, and
output the data read from the memory array when the output enable signal changes from the second level to the first level.

9. The pseudo-static random-access memory as claimed in claim 8, wherein the delay control circuit outputs a chip disable signal at the second level to the input/output control circuit after the output enable signal changes from the second level to the first level and is then delayed by the burst length, and
the input/output control circuit outputs the output enable signal at the second level to the input/output circuit to end data output when the chip disable signal changes from the first level to the second level.

10. The pseudo-static random-access memory as claimed in claim 1, wherein the delay control circuit comprises:
a confirmation signal control circuit configured to receive the column select enable signal, the clock signal, the burst length, a chip disable signal, and a reset signal to generate the first confirmation signal; and
a chip disable signal control circuit configured to receive the column select enable signal, an output enable signal, the clock signal, the burst length, and the reset signal to generate the chip disable signal.

11. The pseudo-static random-access memory as claimed in claim 10, wherein
the confirmation signal control circuit comprises
a first delay circuit configured to delay the column select enable signal by a time equal to the burst length to generate the first confirmation signal, and
a first counting circuit configured to count the clock signal to set a delay time of the column select enable signal equal to the burst length; and
the chip disable signal control circuit comprises:
a select circuit configured to select the output enable signal or the column select enable signal as an output according to a write signal,
a second delay circuit configured to delay the output enable signal provided by the select circuit by a time equal to the burst length to generate a second confirmation signal during a read operation,
a second counting circuit configured to count the clock signal to set a delay time of the output enable signal equal to the burst length,
a logic circuit, and
a flip-flop configured to receive the second confirmation signal, the internal enable signal, and the reset signal to generate the chip disable signal through the logic circuit.

12. A reading method suitable for a pseudo-static random-access memory, the reading method comprising:

receiving a read command sequence from a data input/
output pin, and generating a read command, a read row
address, and a read column address according to the
read command sequence;

decoding the read command, and starting to count a clock
signal when an internal enable signal changes from a
disable state to an enable state, and outputting a column
address strobe signal a first level when a count of the
clock signal reaches a first clock amount;

counting the clock signal during a period starting from
when the column address strobe signal changes from a
second level to the first level to when the internal
enable signal changes from an enable state to a disable
state, so as to provide a burst length accordingly; and outputting a first confirmation signal at the first level after
a column select enable signal changes from the second
level to the first level and is then delayed by the burst
length, such that a length of a column select signal is
equal to the burst length.

13. The reading method as claimed in claim 12, further comprising:
starting to count the clock signal when the column address strobe signal changes from the second level to the first level, and outputting the column select enable signal at the first level when the count reaches a first delay time.

14. The reading method as claimed in claim 13, further comprising:
in response to the clock signal, outputting the column select signal to a memory array according to the read column address when the column select enable signal changes from the second level to the first level.

15. The reading method of claim 14, wherein outputting the column select signal to the memory array according to the read column address in response to the clock signal when the column select enable signal changes from the second level to the first level comprises:
receiving the clock signal, the column select enable signal, and the first confirmation signal, and outputting a column-select pulse sequence in response to the clock signal when the column select enable signal changes from the second level to the first level; and
outputting the column select signal to the memory array in response to the column-select pulse sequence according to the read column address.

16. The reading method as claimed in claim 15, further comprising:
outputting the column select enable signal at the second level when the first confirmation signal changes from the second level to the first level.

17. The reading method as claimed in claim 15, further comprising:

stopping outputting the column-select pulse sequence when the first confirmation signal changes from the second level to the first level, so as to stop outputting the column select signal, and outputting a control pulse to respectively output the column address strobe signal at the second level and a row address strobe signal at the second level.

18. The reading method as claimed in claim 12, further comprising:
outputting a chip disable signal at the second level after an output enable signal changes from the second level to the first level and is then delayed by the burst length; and
outputting the output enable signal at the second level to end data output when the chip disable signal changes from the first level to the second level.

19. The reading method as claimed in claim 12, wherein outputting the first confirmation signal at the first level comprises:
generating the first confirmation signal according to the column select enable signal, the clock signal, the burst length, a chip disable signal, and a reset signal,
the reading method further comprises:
generating the chip disable signal according to the column select enable signal, an output enable signal, the clock signal, the burst length, and the reset signal.

20. The reading method as claimed in claim 19, wherein generating the first confirmation signal according to the column select enable signal, the clock signal, the burst length, the chip disable signal, and the reset signal comprises
delaying the column select enable signal by a time equal to the burst length to generate the first confirmation signal, and
counting the clock signal to set a delay time of the column select enable signal equal to the burst length; and
generating the chip disable signal according to the column select enable signal, the output enable signal, the clock signal, the burst length, and the reset signal comprises
selecting the output enable signal or the column select enable signal as an output according to a write signal,
delaying the provided output enable signal by a time equal to the burst length to generate a second confirmation signal during a read operation,
counting the clock signal to set a delay time of the output enable signal equal to the burst length, and
generating the chip disable signal according to the second confirmation signal, the internal enable signal, and the reset signal.

* * * * *